United States Patent [19]

Freeborn

[11] 3,883,865

[45] May 13, 1975

[54] D TO A CONVERTER WITH HIGH-SPEED, TRANSIENT-FREE SWITCHING CIRCUITRY

[75] Inventor: John C. Freeborn, West Covina, Calif.

[73] Assignee: Honeywell, Inc., Minneapolis, Minn.

[22] Filed: Jan. 30, 1974

[21] Appl. No.: 437,908

[52] U.S. Cl. .......................... 340/347 DA; 307/239

[51] Int. Cl. ........................................... H03k 13/04

[58] Field of Search....... 340/347 DA; 307/239, 242

[56] References Cited

UNITED STATES PATENTS

| | | | |
|---|---|---|---|
| 3,541,239 | 11/1970 | Reid | 178/68 |
| 3,544,994 | 12/1970 | Hanson et al. | 340/347 |
| 3,685,045 | 8/1972 | Pastoriza | 340/347 DA |
| 3,697,980 | 10/1972 | Boinodiris et al. | 340/347 DA |
| 3,766,402 | 10/1973 | Raamot | 307/44 |

*Primary Examiner*—Malcolm A. Morrison
*Assistant Examiner*—Vincent J. Sunderdick

[57] ABSTRACT

Transient free, high speed switching circuitry for a multiplying D to A converter including a pair of conductors at different potentials connected through parallel paths each comprising an impedance element and an electronic switch. Rapid switching is achieved by impressing a bias voltage across the switch greater than the potential difference between the conductors. A diode is employed to prevent the bias voltage from affecting the potentials on the conductors. Transients which would otherwise result while attempting to rapidly change the voltage across the diode during switching operation are avoided by employing diode clamping means to limit the voltage across the diode to a magnitude just sufficient to prevent conduction therethrough.

10 Claims, 3 Drawing Figures

D TO A CONVERTER WITH HIGH-SPEED, TRANSIENT-FREE SWITCHING CIRCUITRY

BACKGROUND OF THE INVENTION

The invention herein described was made in the course of or under a contract, or subcontract thereunder, with the Department of the Navy.

The invention pertains generally to digital-to-analog converters, and more specifically to high speed converters with circuitry for concurrently increasing switching speed and suppressing switching transients which would otherwise result. The invention has particular applicability to multiplying digital-to-analog converters of the parallel bit, series switch type in which switching of a variable voltage is required.

Ever since the inception of practical digital computers they have been employed in larger computing, control and display subsystems and systems in which data and/or information in analog form is required. In such subsystems and systems, an interface is necessary to convert data from digital to analog form. Digital-to-analog converters for performing this function have been implemented in a variety of ways. The principal catagories of digital-to-analog converters, their principles of operation and significant features of implementing circuitry are surveyed in an article entitled "An Electronic Design Practical Guide to D/A Conversion" which appeared in the Oct. 24, 1968 issue of *Electronic Design*, Vol. 22, pages 49–88.

The operational capabilities and flexibility of digital computers and the variety of applications which they are used has increased very rapidly in recent years. Notable advances have been made in the area of operational speed. This has resulted in corresponding demands with regard to the operational speed of associated digital-to-analog converters.

Various schemes for increasing the operational speed of digital-to-analog converters have been devised. The above-identified article discusses several factors which influence operational speed. Also, U.S. Pat. No. 2,963,698 issued to G. M. Slocomb discloses a digital-to-analog converter with transistor switching circuitry designed for high speed operation. However, even since development of the disclosed circuit, operational speeds for typical systems have been further increased to the point that additional advances in digital-to-analog converter design are required.

One known technique for increasing the switching speed of a switching transistor is to increase its driving and/or biasing voltages. If discrete biasing circuitry is provided, it is necessary to isolate the signals to be switched from effects of the biasing voltage. This may be accomplished by means of a diode which is reversed biased by the biasing voltage. However, a problem experienced with this scheme is that it may result in switching transients which are transmitted to parts of the system external to the digital-to-analog converter. This problem has been traced to the inherent junction capacitance of the isolating diode. Specifically, when the switching transistor is in a nonconducting state, a voltage equal to the difference between the biasing voltage and the voltage to be switched exists across the diode. Causing the transistor to conduct ideally immediately reduces the voltage across the diode to its forward voltage drop (approximately 0.7 volts in a silicon diode). However, as a practical matter the voltage across the diode cannot be instantaneously reduced to its forward voltage drop because of its junction capacitance. Thus, dropping the voltage on the switching transistor side of the diode by an amount equal to the bias voltage momentarily causes the voltage on the other side of the diode to drop by a like amount. This voltage excursion may be several times the magnitude of the voltage being switched. Further, the described transient condition may exist for a period of time which is unacceptably long for many applications.

Hence, it is apparent that a need exists for improved digital-to-analog converters capable of simultaneous high speed and transient free operation. The problems related to switching transients in prior art high speed digital-to-analog converters have been overcome in the applicant's invention which retains the beneficial effect of a large biasing voltage for increasing switching speed, but eliminates the problems resulting from the inherent junction capacitance of the isolating diode by limiting the voltage across the diode to the magnitude just sufficient to prevent conduction therethrough.

SUMMARY OF THE INVENTION

The applicant's high speed transient free digital-to-analog converter basically comprises a pair of conductors at different voltages connected by a plurality of parallel branches, each comprising a series connection of an impedance element and an electronic switch. The switches may be controlled by digital signals from a digital computer. The impedance elements may be sized to correspond to the weights of the digital signals supplied to the associated switches. Means is provided for impressing a bias voltage across each switch in excess of the voltage difference between the conductors so as to achieve high switching speed. An isolating diode is provided to prevent the bias voltage from affecting the voltage on the conductors. A clamping circuit limits the voltage across the diode to a magnitude just sufficient to prevent conduction therethrough. This may be accomplished by including the isolating diode in a series loop of diode junctions in which equal numbers of junctions are oriented in opposite directions. Certain of the diode junctions may comprise base-emitter junctions of transistors utilized for other purposes in the digital-to-analog converter.

Accordingly, it is a primary object of this invention to provide a high performance digital-to-analog converter capable of simultaneous high speed and transient free operation.

It is a further object of this invention to provide a unique digital-to-analog converter including switches biased for high speed operation.

It is yet a further object to provide a unique digital-to-analog converter including diode means for isolating the voltage to be switched from the bias voltage and means for limiting the voltage across the diode means to prevent voltage changes from being coupled therethrough because of its inherent junction capacitance.

Additional objects of the present invention may be ascertained from a study of the disclosure, drawings, and appended claims.

DESCRIPTION OF THE PREFERRED EMBODIMENT

Figure 1:
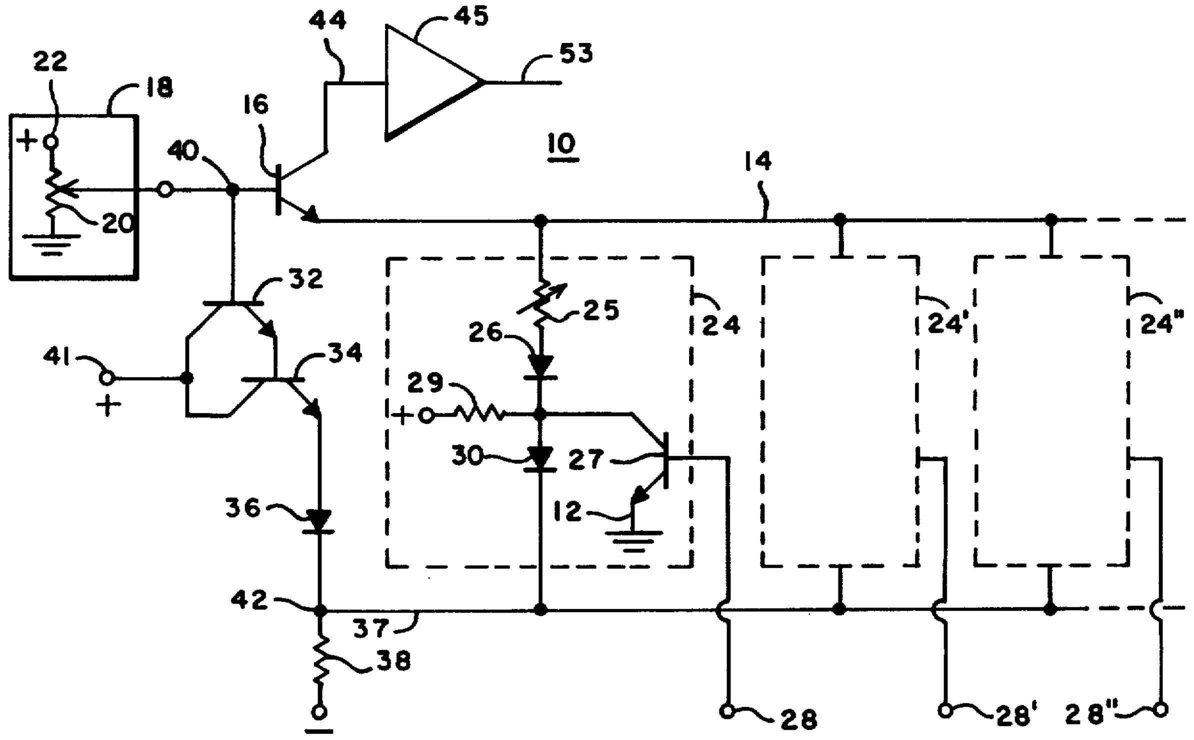
FIG. 1 is a partial schematic drawing of a digital-to-analog converter in accordance with the applicant's invention.
Figure 2:
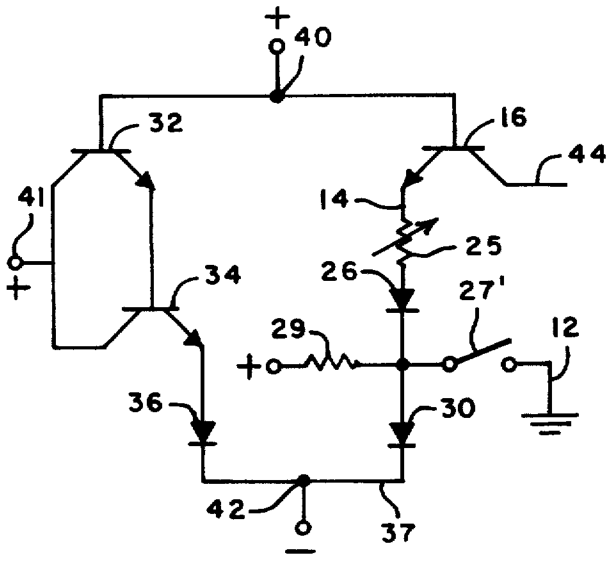
FIG. 2 is a portion of the converter of FIG. 1 redrawn to emphasize novel aspects of the applicant's invention and aid in understanding its operation.

FIG. 1 illustrates a high speed, transient free multiplying digital-to-analog converter in accordance with the applicant's invention. The converter, which is generally identified by reference numeral 10, is of the parallel resistor type having a transistor switch in series with each resistor. The circuitry of FIG. 2 is identical to a portion of the circuitry of FIG. 1. Corresponding elements in FIGS. 1 and 2 are identified with the same reference numerals.

Converter 10 comprises a pair of conductors 12 and 14 for conducting current at first and second reference potentials respectively. Conductor 12 is illustrated as being at ground potential. Conductor 14 is maintained at a positive potential by virtue of being connected to the emitter of an NPN transistor 16 whose base is supplied with a positive reference voltage from a source 18. For purposes of simplifying the following description, source 18 is illustrated as comprising a potentiometer 20 connected between a positive voltage source 22 and ground. The wiper of potentiometer 20 is connected to the base of transistor 16. conductor 14 and transistor 16 are hereinafter collectively referred to as conductor means.

It should be understood that source 18 is shown as comprising a potentiometer for illustrative purposes only. Many other voltage sources are equally applicable. In one system in which the applicant's converter was used source 18 actually comprised a separate digital-to-analog converter.

A plurality of parallel branches identified by reference numerals 24, 24' and 24'' are connected between conductors 12 and 14. Parallel branches are of identical form, but may have circuit elements of different values as will be noted. In addition, the appropriate number of parallel branches depends on the particular application for which the converter is intended, and may be more or fewer than shown in FIG. 1.

Each branch 24 comprises an impedance element 25, a diode 26, and an NPN transistor 27 connected in series. Transistor 27 is schematically illustrated in FIG. 2 as a switch 27'. Transistor 27 is controlled by a digital signal supplied to a terminal 28. 28' or 28'' which is connected to the base of transistor 27. The cathode of diode 26 and the collector of transistor 27 are connected together and supplied with a positive bias voltage through a resistor 29. The bias voltage tends to be more positive than the voltage on conductor 14, and serves to increase the switching speed of transistor 27. Diode 26 prevents the bias voltage from affecting the voltage on conductor 14.

The actual bias voltage at the cathode of diode 26 and collector of transistor 27 is limited by means of a clamping circuit comprising a diode 30, a pair of emitter follower connected NPN transistors 32 and 34, and a diode 36. The anode of diode 30 is connected to the cathode of diode 26 and the collector of transistor 27. The cathode of diode 30 is connected to a conductor 37 which is supplied with a negative bias voltage through a resistor 38. The base of transistor 32 is connected to the base of transistor 16 at a junction point 40. The emitter of transistor 32 is connected to the base of transistor 34. The collectors of transistors 32 and 34 are connected to a common positive voltage source 41. The emitter of transistor 34 is connected to the anode of diode 36. The cathode of diode 36 is connected to conductor 37 at a juntion point 42.

The base-emitter junctions of transistors 32 and 34 each comprise a diode junction. As seen in FIG. 2, the base-emitter junctions of transistors 32 and 34 and diode 36 form a series of three like-oriented diode junctions. The base-emitter junctions of transistor 16, 32, and 34 and diodes 26, 30 and 36 form a series loop of diode junctions in which equal numbers of diode junctions are oppositely oriented.

In operation, the voltage on conductor 14 is determined by the voltage at the base of transistor 16 which is determined by source 18. More specifically, the voltage on conductor 14 is one forward diode voltage drop (approximately 0.7 volts in a silicon transistor) below the voltage on the base of transistor 16. Conductor 14 serves as a current source to supply current through parallel branches 24, 24' and 24''. The magnitude of the current flowing through conductor 14 is determined by whether transistor 27 (or its counterpart in branches 24', 24'', etc.) is in a conducting or nonconducting state, the magnitude of the impedance presented by the associated impedance element(s) 25, and the potential difference between conductors 12 and 14. The magnitudes of the impedances presented by impedance element 25 and its counterparts may be equal or weighted in any desired manner. As shown in FIGS. 1 and 2, impedance element 25 is a variable resistor. However, other suitable forms of impedance elements may be used equally effectively. If the impedances are equal, each additional transistor 27 switched to its conducting state will increase the current in conductor 14 by an equal increment. If the impedances are weighted, switching of the associated transistors will change the current in conductor 14 in a corresponding fashion.

The voltage on conductor 37 is also determined by the voltage supplied to the base of transistor 16. The same voltage is supplied to the base of transistor 32 which, in turn, supplies that voltage less one forward diode voltage drop to the base of transistor 34. Transistor 34 supplies its base voltage less one forward diode voltage drop to the anode of diode 36. Diode 36 provides one additional forward diode voltage drop. The voltage on conductor 37 is thus equal to the voltage at the base of transistor 16 less three forward diode voltage drops (approximately 2.1 volts). Transistors 32 and 34 are maintained in their conducting states by the positive collector voltages supplied by source 41. These transistors present a high impedance at the base of transistor 16 so as not to significantly affect its base voltage, while providing a low impedance between positive voltage source 41 and the negative voltage source through diode 36 and resistor 38.

Diode 30 serves to limit the voltage at the cathode of diode 26 to a magnitude one forward diode voltage drop above the voltage on conductor 37. Thus, when transistor 27 is in a nonconducting state, the voltage across diode 26 is fixed at one forward diode voltage drop which is insufficient to permit conduction therethrough. when transistor 27 is switched to a conducting state, the voltage at the cathode of diode 26 decreases just sufficiently to produce conduction through diode 26 and impedance element 25. Rapid switching of transistor 27 to its nonconducting state is achieved because its collector is pulled toward the positive bias voltage supplied through resistor 29, but is stopped at a voltage just sufficient to terminate conduction through diode 26. Generation of transients as a result of the inherent junction capacitance of diode 26 is prevented because only very small voltage changes across diode 26 are permitted.

The applicant's unique clamping arrangement provides for high speed, transient free digital-to-analog conversion over a significant range of voltages at the base of transistor 16. Thus, it is ideally suited for multiplying digital-to-analog conversion. Satisfactory operation under such conditions is insured because the voltage across diode 26 is identical whether computed through transistor 16 or through transistors 32 and 34 and diodes 36 and 30.

Figure 3:
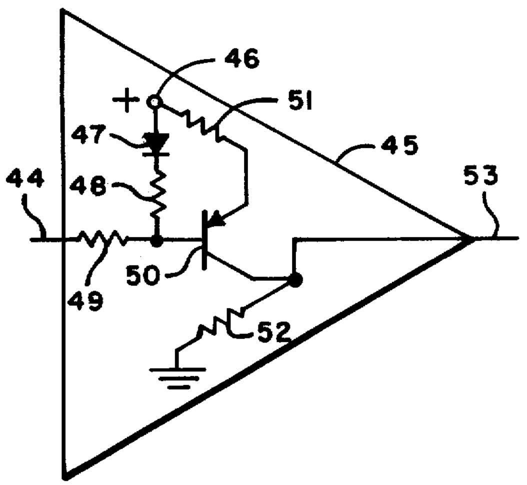
FIG. 3 is a circuit diagram of a current-to-voltage converter and amplifier suitable for interfacing the converter of FIG. 1 with apparatus requiring a voltage signal.

A useful analog output signal is produced at the collector of transistor 16. This signal is in the form of a current signal whose magnitude varies in accordance with digital signals supplied to terminals 28, 28' and 28''. More specifically, the current through conductor 14, which varies in accordance with the digital signals, is supplied through conductor 44 which is connected to the collector of transistor 16. For applications requiring an analog voltage signal, the current signal may be converted to a voltage signal by circuitry 45 shown in detail in FIG. 3.

Circuitry 45 supplies current from a positive source 46 through a diode 47 and resistors 48 and 49 to the collector of transistor 16. The voltage at the junction of resistors 48 and 49 varies in proportion to the current flowing therethrough. This voltage is supplied to the base of a PNP transistor 50 whose emitter is connected to positive source 46 through a resistor 51. Diode 47 and the base-emitter junction of transistor 50 respond to temperature variations in the same manner. Thus, diode 47 provides temperature compensation. the collector of transistor 50 is connected to ground through a resistor 52. An output conductor is also connected to the junction between resistor 52 and the collector of transistor 50. Conduction of transistor 50 varies directly as the control voltage supplied to its base. Thus, a voltage corresponding to the current in conductor 44 is supplied on output conductor 53. The applicanat's converter with circuitry 45 is suitable for applications requiring an analog voltage output signal.

Although a specific embodiment of apparatus for effecting high speed, transient free conversion of an digital signals to an analog signals is shown for illustrative purposes, other embodiments which do not depart from the applicant's contemplation and teaching will be apparent to those skilled in the art. The applicant does not intend that coverage be limited to the disclosed embodiment, but only by the terms of the appended claims.

What is claimed is:

1. In a digital-to-analog converter of the type wherein current in a conductor at a positive reference voltage is selectively conducted to ground through at least one of a plurality of parallel branches, each comprising a resistor connected to the conductor and a first NPN transistor having its emitter connected to ground, the improvement which comprises:

a first diode in series with the resistor and the transistor so that its anode is connected to the resistor and its cathode is connected to the collector of the transistor;

bias means for biasing the collector of the transistor to a voltage more positive than the positive reference voltage; and clamping means for limiting the voltage at the collector of the transistor to a voltage no more positive than necessary to prevent conduction through said first diode.

2. The converter of claim 1 including a current source for supplying current to the conductor at a positive reference voltage, said current source comprising:

a second NPN transistor having a collector connected to a positive voltage source, an emitter connected to said conductor and a base electrode for receiving a signal for controlling the magnitude of the positive reference voltage; and means for supplying a control signal to the base of said second NPN transistor.

3. The converter of claim 2 wherein said clamping means comprises:

a first junction point biased to a voltage no more positive than ground;

a second diode having its anode connected to the cathode of said first diode and its cathode connected to said first junction point; and means including a series of three like-oriented diode junctions connecting the base of said second NPN transistor to said first junction point, the diode junctions having their cathodes oriented toward said first junction point.

4. The converter of claim 3 wherein two of said series of three diode junctions comprise base-emitter junctions of third and fourth NPN transistors, the base of said third transistor being connected to the base of said second transistor, the emitter of the third transistor being connected to the base of the fourth transistor, and the collectors of the third and fourth transistors being connected to a positive voltage source.

5. A digital-to-analog converter comprising:

a first conductor for conducting current at a first reference potential;

second conductor means for conducting current at a second reference potential of a predetermined polarity relative to the first reference potential;

a plurality of parallel branches connecting said first conductor and said seecond conductor means, each branch comprising impedance means, first diode means and a digitally controlled switch connected in series, said first diode means being oriented to permit current flow in response to the voltage difference between said first conductor and said second conductor means;

bias means for applying a bias voltage across said switch, the bais voltage being of same polarity as the voltage impressed across said switch by said first conductor and said second conductor means, and of a greater magnitude than the voltage difference therebetween; and clamping means for naormally maintaining a voltage across said first diode means just sufficient to prevent conduction therethrough.

6. The converter of claim 5 wherein said switch is an electronic switch having first and second primary electrodes and a control electrode for receiving a digital signal for controlling current flow between the primary electrodes, the first primary electrode being connected to said first conductor.

7. The converter of claim 6 wherein:

said clamping means comprises second diode means; and said second conductor means and said second diode means are interconnected with said first diode means to form a series loop of diode junctions in which equal numbers of diode junctions are oppositely oriented.

8. The converter of claim 7 wherein said clamping means further comprises:

a first junction point biased to a voltage whose difference with respect to the second reference potential is of the same polarity and at least as great as that of the first reference potential;

a second junction point on said second conductor means; and means including a series of like-oriented diode junctions connecting said first and second junction points, said series of like-oriented diode junctions comprising a portion of said series loop of diode junctions.

9. The converter of claim 8 wherein:

said second conductor means includes a first diode junction located in said series loop of diode junctions between said second junction point and said first diode means, said first diode junction having the same orientation as said first diode means;

said second diode means including a diode connected between said first diode means and said first junction point and having the same orientation as said first diode means; and said series of like-oriented diode junctions includes three such junctions.

10. The converter of claim 9 wherein:

said first diode junction is the base-emitter junction of a first NPN transistor whose base is connected to said second junction point and whose emitter is connected to said plurality of parallel branches; and said series of like-oriented diodes junctions includes the base-emitter junctions of second the third NPN transistors, the base and emitter of said second NPN transistor being respectively connected to said second junction point and the base of said third NPN transistor.

* * * * *